United States Patent
Chen et al.

(10) Patent No.: US 7,355,907 B2
(45) Date of Patent: Apr. 8, 2008

(54) PERFORMING READ AND WRITE OPERATIONS IN THE SAME CYCLE FOR AN SRAM DEVICE

(75) Inventors: Hsin-Ley Suzanne Chen, San Jose, CA (US); Chih-Chiang Tseng, Fremont, CA (US); Mu-Hsiang Huang, San Jose, CA (US)

(73) Assignees: Sony Corporation, Tokyo (JP); Sony Electronics, Park Ridge, NJ (US)

( * ) Notice: Subject to any disclaimer, the term of this patent is extended or adjusted under 35 U.S.C. 154(b) by 180 days.

(21) Appl. No.: 11/404,191

(22) Filed: Apr. 14, 2006

(65) Prior Publication Data

US 2007/0097780 A1    May 3, 2007

Related U.S. Application Data

(60) Provisional application No. 60/731,395, filed on Oct. 28, 2005.

(51) Int. Cl.
*G11C 7/00* (2006.01)
(52) U.S. Cl. .......... 365/191; 365/233; 365/193
(58) Field of Classification Search .......... 365/233, 365/191, 193
See application file for complete search history.

(56) References Cited

U.S. PATENT DOCUMENTS

| 6,629,223 B2 | 9/2003 | Bachot et al. .......... 711/167 |
| 6,836,144 B1 | 12/2004 | Bui et al. .......... 326/32 |
| 7,253,656 B2 | 8/2007 | Costa et al. .......... 326/30 |
| 2005/0190640 A1* | 9/2005 | Braceras et al. .......... 365/233 |

* cited by examiner

*Primary Examiner*—Van Thu Nguyen
*Assistant Examiner*—Han Yang
(74) *Attorney, Agent, or Firm*—Haverstock & Owens, LLP

(57) ABSTRACT

A decoding signal circuit is configured to generate a dual operation decoding signal that enables a read operation and a write operation to be performed in one clock cycle. The decoding signal circuit is configured such that a read decoding signal and a write decoding signal are generated and multiplexed together to form the dual operation decoding signal. The memory device receives a read address and a write address consecutively in one cycle to generate the dual operation decoding signal. A single operation, such as a read only operation or a write only operation, can be performed as well as the dual operation of performing the read operation and the write operation in the same cycle.

10 Claims, 4 Drawing Sheets

PERFORMING READ AND WRITE OPERATIONS IN THE SAME CYCLE FOR AN SRAM DEVICE

RELATED APPLICATIONS

This application claims priority of U.S. provisional application, Ser. No. 60/731,395, filed Oct. 28, 2005, and entitled "DECODING FOR READ AND WRITE IN SAME CYCLE DUAL SELF-TIMED PULSE FOR READ AND WRITE OPERATION", by the same inventors. This application incorporates U.S. provisional application, Ser. No. 60/731,395, filed Oct. 28, 2005, and entitled "DECODING FOR READ AND WRITE IN SAME CYCLE DUAL SELF-TIMED PULSE FOR READ AND WRITE OPERATION", in its entirety by reference.

FIELD OF THE INVENTION

The present invention relates to the field of memory devices. More particularly, the present invention relates to the field of high-speed SRAM devices.

BACKGROUND OF THE INVENTION

Static Random Access Memory (SRAM) is a type of semiconductor memory. Data stored in an SRAM is retained as long as power remains applied, unlike dynamic RAM (DRAM) that needs to be periodically refreshed, read-only memory (ROM), or flash memory. SRAM is referred to as volatile memory since data is preserved only while power is continuously applied. SRAM provides faster access to data, but is more expensive than DRAM. SRAM is typically used for a computer's cache memory and as part of the random access memory digital-to-analog converter on a video card.

Random access means that locations in the memory are written to or read from in any order, regardless of the memory location that was last accessed. Each bit in a conventional SRAM device is stored on four transistors that form two cross-coupled inverters. Such a memory cell has two stable states which are used to denote a logic 0 and a logic 1. Two additional access transistors serve to control the access to the memory cell during read and write operations. As such, it typically takes six transistors to store one memory bit.

Access to each memory cell is enabled by a word line, which controls the two access transistors. The two access transistors control whether the memory cell is connected to one or both bit lines, which are used to transfer data during both read and write operations. Two bit lines are typically used to improve noise margins.

Three different operations are applied to a memory cell, a standby operation, a read operation, and a write operation. For the standby operation, if the word line is not asserted, the two access transistors disconnect the memory cell from the bit lines, and the two cross coupled inverters continue to reinforce each other as long as they are disconnected from the bit lines.

A read operation is initiated by pre-charging both the bit lines to a logical 1, then asserting the word line, thereby enabling both the access transistors. Then, the data stored in the two cross-coupled inverters is transferred to the bit lines. If the data stored in the memory cell is a logical 1, then a first bit line is discharged to a logical 0, and a second bit line is pulled to a logical 1. If the content of the memory cell is a logical 0, then the first bit line is pulled towards a logical 1 and the second bit line is discharged to a logical 0.

A write operation is initiated by applying the data value to be written to the bit lines. If the data value to be written is a logical 0, then a logical 0 is applied to the bit lines by setting the first bit line to a logical 1 and the second bit line to a logical 0. If the data value to be written is a logical 1, then the first bit line is set to a logical 0 and the second bit line is set to a logical 0. The word line is then asserted and the data value that is to be stored is latched by the two cross-coupled inverters. The bit line input-drivers are designed to be much stronger than the relatively weak transistors in the memory cell itself, so that the previous state of the cross-coupled inverters is easily overwritten. Careful sizing of the transistors in a SRAM cell is needed to ensure proper operation.

Conventional SRAMS perform one operation, either a read operation or a write operation, in one clock cycle. An SRAM receives one set of addresses and performs a first level, global predecode. Then, the predecoding lines within the SRAM distribute the predecode signals according to a decoding map. A second level decoding is performed locally on the predecoding signals to select a specific memory location. The read operation or the write operation is selected via a control pin. If the read operation is selected, then the data is read from the specific memory location via a data output pin. If the write operation is selected, then the data is written into the specific memory location via a data input pin.

Conventionally, a decoding signal is generated from an emulated self-timed pulse, which is triggered from the rising edge of an external clock. An emulation circuit generates the decoding signal by either emulating a minimum read pulse width or by emulating a minimum write pulse width. The read pulse width is wider than the write pulse width. The minimum cycle time is limited by the decoding signal pulse width and the time needed for bit-line level recovery.

FIG. 1 illustrates the waveforms associated with conventional SRAMS. An external clock signal is provided to the SRAM. The emulated self-timed pulse is triggered by the rising edge of the external clock signal. The decoding signal is generated from the self-timed pulse. A width of each pulse of the decoding signal is equal to a pulse width of the self-timed pulse. The pulse width corresponds to the amount of time required by the SRAM to perform the read operation or the write operation. The pulse width varies depending on whether a read operation or a write operation is performed. The result is a decoding signal where each cycle represents either a read operation or a write operation, but not both.

SUMMARY OF THE INVENTION

A decoding signal circuit is configured to generate a dual operation decoding signal that enables a read operation and a write operation to be performed by a memory device in one clock cycle. In one embodiment, the memory device is a high-speed SRAM. The decoding signal circuit is configured such that a read decoding signal and a write decoding signal are generated and multiplexed together to form the dual operation decoding signal. The memory device receives a read address and a write address consecutively in one cycle to generate the dual operation decoding signal. A single operation, such as a read only operation or a write only operation, can be performed as well as the dual operation of performing the read operation and the write operation in the same cycle.

The decoding signal circuit includes dual dynamic latches to generate the read decoding signal and the write decoding signal, which are then multiplexed. A first dynamic latch receives a read address and a generated read self-timed pulse. The first dynamic latch then generates the read decode signal. A second latch receives a write address and a write self-timed pulse. The second dynamic latch then generates the write decode signal.

The read self-timed pulse is triggered from the rising edge of an external clock signal. The write self-timed pulse is triggered from the falling edge of the read self-timed pulse. A minimum cycle time is limited by a read pulse width, a write pulse width, a bit-line recovery time, and a gap between the read pulse and the write pulse. The read pulse width is the amount of time needed to perform a corresponding read operation. The write pulse width is the amount of time needed to perform a corresponding write operation. Separate sets of programmable tuning circuits adjust the read pulse width and/or the write pulse width in the case of process variations. In this manner, the speed performance is optimized.

The first dynamic latch functions as a read emulator and includes a pass gate and a pull-down transistor. The pull-down transistor is tied to high, and once the pass gate is on, the output of the pull-down transistor emulates a read operation. That is, a bit-line precharges to a high level. The bit-line discharges through the pass gate and the pull-down transistor when the pass gate is selected. The pass gate control is emulated from a section word line (swl) decoder.

The second dynamic latch functions as a write emulator. In one embodiment, the second dynamic latch includes a group of multiple six-transistor SRAM cells. Multiple cells are used since single cell operation current is very small, which is not sufficient to emulate a write operation. By placing a load on the bit-line, a data value stored in the memory cell is overwritten through the bit-line.

A gap time is generated between the read pulse and the write pulse so that write data is not mistakenly written into a memory cell intended to be read. The gap time between read pulse and the write pulse corresponds to the time between the falling edge of the read pulse and the rising edge of the write pulse. Because of different characteristics of p-mos transistors and n-mos transistors, the low-to-high delay and the high-to-low delay is diverse after several gates. When the falling edge slew rate of the read decoding signal is insufficient, such as after a long RC line, write data is mistakenly written into a read memory cell if the gap time is too short. In such a case, the gap time is increased at the cost of increasing the overall cycle time. Conversely, where the slew rate is sufficient to prevent unwanted overwriting, the gap time can be reduced to decrease the overall cycle time.

The first dynamic latch functioning as the read emulator also receives a read reset, or precharge, signal. The read reset signal is a self-timed pulse triggered from the falling edge of the read self-timed pulse. The read reset signal is blocked when the write decode is valid or when the read decode is not valid. The second dynamic latch functioning as the write emulator receives a write reset signal, which is a self-timed pulse triggered from the falling edge of the write self-timed pulse.

In one aspect, a circuit to generate a decoding signal for a memory device is described. The circuit includes a clock generating circuit configured to receive an external clock signal, to generate a read pulse in response to a rising edge of the external clock signal, and to generate a write pulse in response to a falling edge of the read pulse, and a decoding signal circuit coupled to receive the read pulse and the write pulse from the clock generating circuit, wherein the decoding signal circuit is configured to generate a decoding signal in response to the read pulse and the write pulse, further wherein the decoding signal corresponds to a read operation and a write operation executed in one cycle of the external clock signal. The decoding signal circuit can also be configured to receive a read memory address and a write memory address and to generate the decoding signal according to the read memory address and the write memory address. The decoding signal circuit can comprise a first latching circuit configured to generate a read decoding signal according to the read pulse and the read address, wherein the read decoding signal corresponds to the read operation. The decoding signal circuit can also include a second latching circuit configured to generate a write decoding signal according to the write pulse and the write address, wherein the write decoding signal corresponds to the write operation. A duty cycle of the decoding signal can comprise a duty cycle of the read pulse plus a duty cycle of the write pulse. The duty cycle of the decoding signal can also include a gap time between generating the read decoding signal and generating the write decoding signal. The decoding signal circuit can comprise a third latching circuit configured to generate a high decoding signal during the gap time. If the read memory address and the write memory address are the same memory address, then the decoding signal circuit can be configured to generate a single decoding signal directed to the memory address. If the read memory address is different than the write memory address, then the decoding signal circuit can be configured to generate a read decoding signal directed to the read memory address and a write decoding signal directed to the write memory address. The memory device can be a high-speed SRAM device.

In another aspect, a computing device includes a processing module and a memory device. The processing module includes a clock generating circuit configured to receive an external clock signal, to generate a read pulse in response to a rising edge of the external clock signal, and to generate a write pulse in response to a falling edge of the read pulse, and a decoding signal circuit coupled to receive the read pulse and the write pulse from the clock generating circuit, wherein the decoding signal circuit is configured to generate a decoding signal in response to the read pulse and the write pulse, further wherein the decoding signal corresponds to a read operation and a write operation executed in one cycle of the external clock signal. The memory device is coupled to the processing module and is configured to receive the decoding signal and to perform the read operation and the write operation according to the decoding signal. The decoding signal circuit can also be configured to receive a read memory address and a write memory address of the memory device and to generate the decoding signal according to the read memory address and the write memory address. The decoding signal circuit can comprise a first latching circuit configured to generate a read decoding signal according to the read pulse and the read address, wherein the read decoding signal corresponds to the read operation. The decoding signal circuit can also include a second latching circuit configured to generate a write decoding signal according to the write pulse and the write address, wherein the write decoding signal corresponds to the write operation. A duty cycle of the decoding signal can comprise a duty cycle of the read pulse plus a duty cycle of the write pulse. The duty cycle of the decoding signal can also include a gap time between generating the read decoding signal and generating the write decoding signal. The decoding signal circuit can comprise a third latching circuit configured to generate a high decoding signal during the gap time. If the read memory address and the write memory address are the same memory address, then the decoding signal circuit can be configured to generate a single decoding signal directed to the memory address. If the read memory address is different than the write memory address, then the decoding signal circuit can be configured to generate a read decoding signal directed to the read memory address and a write decoding signal directed to the write memory address. The memory device can be a high-speed SRAM device.

In yet another aspect, a method of generating a decoding signal for a memory device is described. The method includes receiving an external clock signal, generating a read pulse in response to a rising edge of the external clock signal, generating a write pulse in response to a falling edge of the read pulse, generating a decoding signal in response to the read pulse and the write pulse, wherein the decoding signal corresponds to a read operation and a write operation, providing the decoding signal to a memory device, and executing the read operation and the write operation according to the decoding signal in one cycle of the external clock signal. The method can also include receiving a read address and a write address. Generating the decoding signal can include generating the decoding signal according to the read pulse, the read memory address, the write pulse, and the write memory address. Generating the decoding signal can also include generating a read decoding signal according to the read pulse and the read address, wherein the read decoding signal corresponds to the read operation. Generating the decoding signal can also include generating a write decoding signal according to the write pulse and the write address, wherein the write decoding signal corresponds to the write operation. Generating the decoding signal can also include generating a duty cycle of the decoding signal such that the duty cycle comprises a duty cycle of the read pulse plus a duty cycle of the write pulse. The duty cycle of the decoding signal can also include a gap time between generating the read decoding signal and generating the write decoding signal. Generating the decoding signal can also include generating a high decoding signal during the gap time. If the read memory address and the write memory address are the same memory address, then generating the decoding signal circuit can include generating a single decoding signal including the read decoding signal and the write decoding signal. Providing the decoding signal to the memory device can comprise providing the single decoding signal to the memory address in the memory device. If the read memory address is different than the write memory address, then generating the decoding signal can comprise generating a read decoding signal directed to the read memory address and generating a write decoding signal directed to the write memory address. Providing the decoding signal to the memory device can comprise providing the read decoding signal to the read memory address in the memory device and providing the write decoding signal to the write memory address in the memory device. The memory device can be a high-speed SRAM device.

BRIEF DESCRIPTION OF THE DRAWINGS

Embodiments of the dual-operation memory device are described relative to the several views of the drawings. Where appropriate and only where identical elements are disclosed and shown in more than one drawing, the same reference numeral will be used to represent such identical elements.

DETAILED DESCRIPTION OF THE EMBODIMENTS

Figure 1:
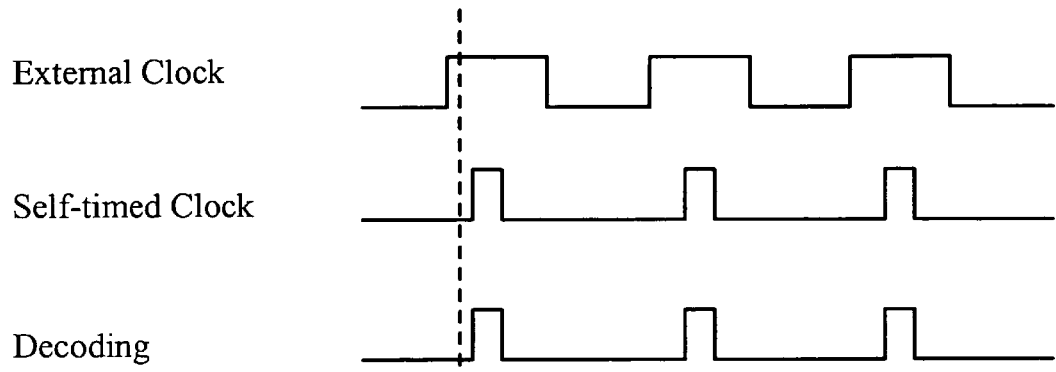
FIG. 1 illustrates the waveforms associated with conventional SRAMS.
Figure 2:
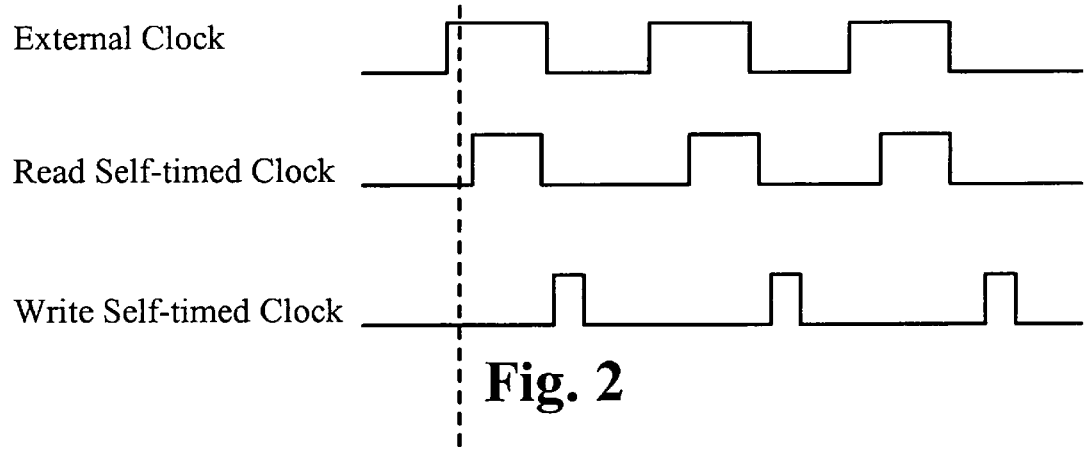
FIG. 2 illustrates the waveforms associated with the dual operation memory device.

FIG. 2 illustrates the waveforms associated with the dual operation memory device. A clock generating circuit receives an external clock signal and generates a read self-timed clock signal and a write self-timed clock signal. The read self-timed clock signal includes a series of read self-timed pulses, each read pulse is triggered by a rising edge of the external clock signal. A read pulse width is determined by the time necessary to perform a corresponding read operation. The write self-timed clock signal includes a series of write self-timed pulses, each write pulse is triggered by a falling edge of a read pulse. A write pulse width is determined by a time necessary to perform a corresponding write operation. The clock generating circuit adds a gap time between each consecutive read pulse and write pulse to prevent write overlap. The read self-timed clock signal is used to subsequently generate a read decoding signal, where the read decoding signal corresponds to a read operation to be performed on a designated memory address. The write self-timed clock signal is used to subsequently generate a write decoding signal, where the write decoding signal corresponds to a write operation to be performed on a designated memory address.

Figure 3:
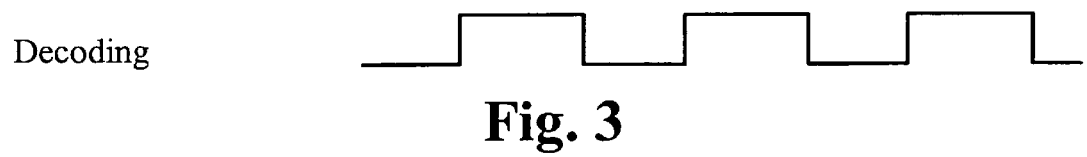
FIG. 3 illustrates a single decoding signal in which a read operation and a write operation are to be performed on the same memory address.

In the case where the memory address is the same for both the read operation and the write operation, then the read decoding signal and the write decoding signal are multiplexed together to form a single decoding signal. FIG. 3 illustrates a single decoding signal in which a read operation and a write operation are to be performed on the same memory address. In this case, the decoding signal is high during a decoding pulse width. The decoding pulse width equals the sum of the read pulse width, the write pulse width, and the gap time. The decoding signal is low for a duration at least equal to the bit-line recovery time.

Figure 4:
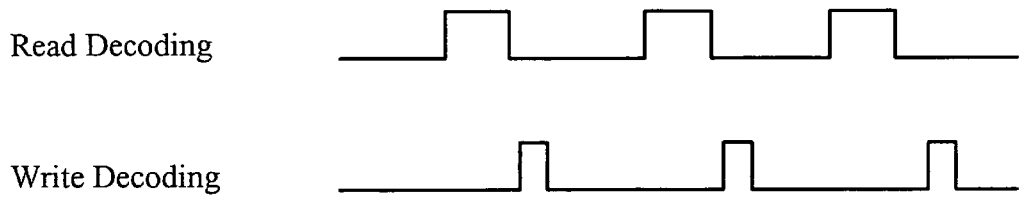
FIG. 4 illustrates the decoding signal as two separate decoding signals, the read decoding signal directed to the first memory address and the write decoding signal directed to the second memory address.

In the case where the read operation is performed at a first memory address and the write operation is performed at a second memory address, the read decoding signal is directed to the first memory address and the write decoding signal is directed to the second memory address. FIG. 4 illustrates the decoding signal as two separate decoding signals, the read decoding signal directed to the first memory address and the write decoding signal directed to the second memory address. In this case, the read decoding pulse width is equal to the read pulse width and the write decoding pulse width is equal to the write pulse width. Both the read decoding signal and the write decoding signal are low for a duration at least equal to the bit-line recovery time.

Figure 5:
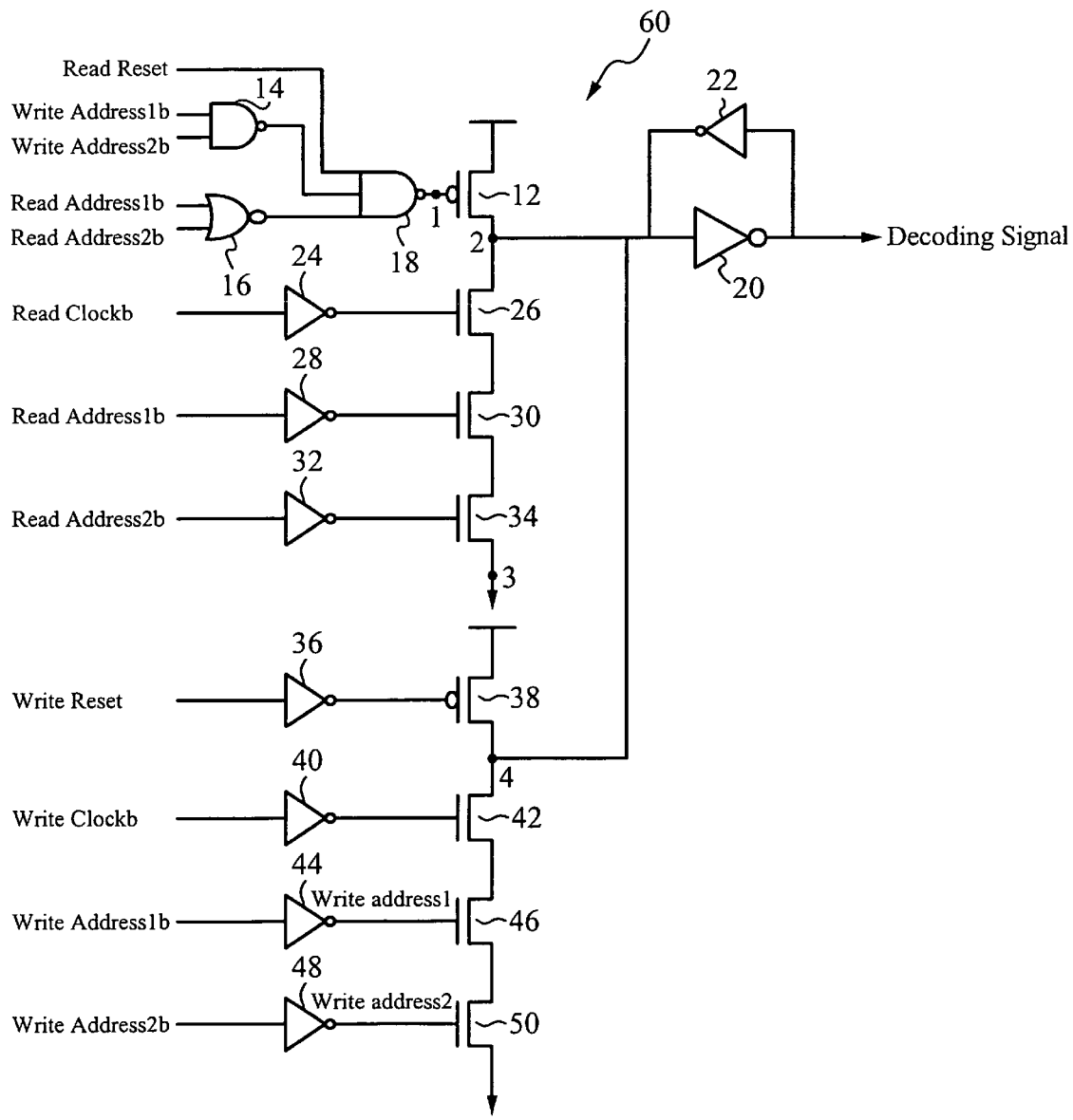
FIG. 5 illustrates an exemplary configuration of a decoding signal circuit 60.

FIG. 5 illustrates an exemplary configuration of a decoding signal circuit 60. The decoding signal circuit 60 includes a pass gate, a first series of pull-down transistors, and a second series of pull-down transistors. The pass gate includes a NAND gate 14, a NOR gate 16 and a NAND gate 18. A write address1 and a write address2 are input to the NAND gate 14. A read address1 and a read address2 are input to the NOR gate 16. An output of the NAND gate 14, an output of the NOR gate 16, and a read reset signal are input to the NAND gate 18.

The first series of pull-down transistors includes the transistors 12, 26, 30, and 34 coupled in series. An inverter 24 is coupled to the base of the transistor 26. An inverter 28 is coupled to the base of the transistor 30. An inverter 32 is coupled to the base of the transistor 34. The read self-timed clock signal from FIG. 2 is input to the inverter 24. The read address1 is input to the inverter 28. The read address2 is input to the inverter 32.

The second series of pull-down transistors includes the transistors 38, 42, 46, and 50 coupled in series. The second series of pull-down transistors is coupled in series to the first series of pull-down transistors. An inverter 36 is coupled to the base of the transistor 38. An inverter 40 is coupled to the base of the transistor 42. An inverter 44 is coupled to the base of the transistor 46. An inverter 48 is coupled to the base of the transistor 50. A write reset signal is input to the inverter 36. The write self-timed clock signal from FIG. 2 is input to the inverter 40. The write address1 is input to the inverter 44. The write address2 is input to the inverter 48.

The collector of the transistor 12 and the collector of the transistor 38 are coupled as input to an inverter 20. An inverter 22 provides a feedback loop to the inverter 20.

An inverse signal to the read decoding signal is provided at the collector of the transistor 12, denoted in FIG. 5 as the node 2. An inverse signal to the write decoding signal is provided at the collector of the transistor 38, denoted in FIG. 5 as the node 4. The signal from the node 2 and the signal from the node 4 are multiplexed as input to the inverter 20. The output of the inverter 20 is the decoding signal.

For high speed memory devices, the read addresses and the write addresses are processed as sets in order to meet the speed requirements. Although two read addresses and two write addresses are shown in FIG. 5, it is understood that more or less than two addresses can be processed simultaneously. For simplicity, the decoding signal circuit is described in terms of a single read address and a single write address input per cycle.

In operation, the base of transistor 12, denoted in FIG. 5 as the node 1, is initially low, thereby charging the node 2 high. This results in a low decoding signal output from the inverter 20. When the read address1 input is high, the corresponding transistor 30 in the first series of transistors is high. When the read self-timed clock signal is also high, the node 2 is pulled low, thereby resulting in a high decoding signal during the read pulse width.

Similarly, when the write address1 input is high, the corresponding transistor 46 in the second series of transistors is high. When the write self-timed clock cycle is also high, the node 4 is pulled low, thereby resulting in a high decoding signal during the write pulse width.

In the case where the read address and the write address are the same, the pass-gate and the transistor 12 function to keep the decoding signal high during the transition (gap time) between the end of the read decoding pulse, at the falling edge of the read self-timed pulse, and the start of the write decoding pulse, at the rising edge of the write self-timed pulse. This results in a single decoding pulse width corresponding to the read pulse width plus the gap time plus the write pulse width.

After each read pulse, the read reset signal is input to the NAND gate 18. The read reset signal is a self-timed pulse triggered from the falling edge of each read pulse. The read reset signal forces the decoding signal low after the read operation is performed. The read reset signal is blocked by the pass-gate when the write decode is valid, that is a write operation is selected, or when the read decode is not valid, that is a read operation is not selected. After each write pulse, the write reset signal is input to the inverter 36. The write reset signal is a self-timed pulse triggered from the falling edge of the write pulse. The write reset signal forces the decoding signal low after the write operation is performed.

If a read operation is selected, but not a write operation, then the read reset signal pulls the node 1 low after the read operation is completed. This pulls the node 2 high, which results in a low decoding signal. In this case, the decoding signal only comprises a read decoding signal, there is not a write decoding signal.

If a write operation is selected, but not a read operation, then the pass-gate and transistor 12 act to block the node 2 from going low until the rising edge of the write pulse. In this case, the decoding signal only comprises a write decoding signal, there is not a read decoding signal.

When the read address and the write address are not the same, then the inverse signal to the read decoding signal generated at the node 2 and the inverse signal to the write decoding signal generated at the node 4 are not multiplexed at the input of the inverter 20. Instead, the inverse signal of the read decoding signal and the inverse signal of the write decoding signal are input to the inverter 20 as independent signals. As such, the read decoding signal output from the inverter 20 is directed to the read address and the write decoding signal output from the inverter 20 is directed to the write address.

Figure 6:
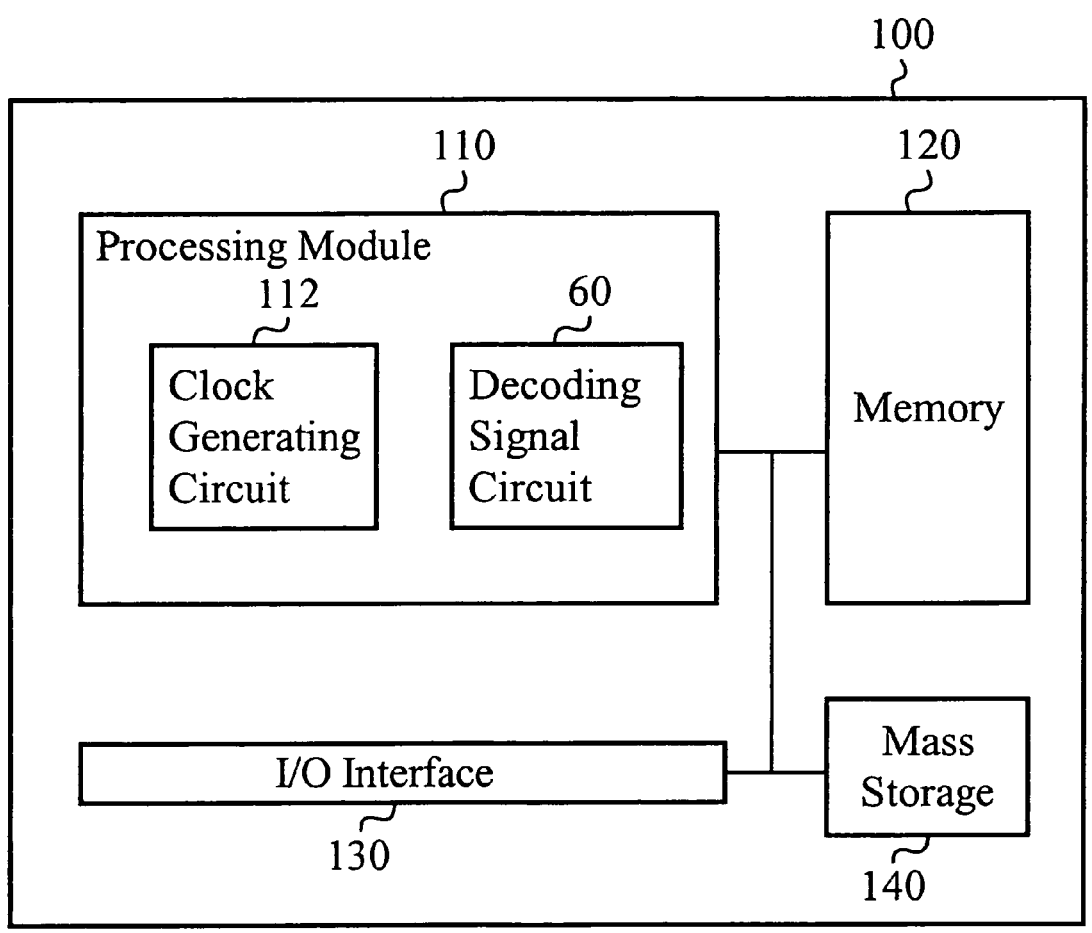
FIG. 6 illustrates a block diagram of an exemplary computing device configured to utilize the decoding signal circuit of FIG. 5.

FIG. 6 illustrates a block diagram of an exemplary computing device 100 configured to utilize the decoding signal circuit 60 of FIG. 5. The computing device 100 is any device capable of writing data to and reading data from a memory device. The computing device 100 includes a processing module 110, a memory 120, an input/output (I/O) interface 130, and a mass storage 140. The mass storage 140 can include both fixed and removable media using any one or more of magnetic, optical or magneto-optical storage technology or any other available mass storage technology. The memory 120 is a random access memory (RAM). In one embodiment, the memory 120 is a high-speed SRAM. The processing module 110 is configured to control the operation of the computing device 10. In particular, the processing module 110 includes the decoding signal circuit 60 and a clock generating circuit 112. The clock generating circuit 112 is configured to provide the read self-timed pulse and the write self-time pulse as described above. In an alternative embodiment, the clock generating circuit and the decoding signal circuit are included within the memory, and the processing module provides control instructions to the clock generating circuit and the decoding signal circuit within the memory. The I/O interface 130 includes a user interface and a network interface. In some embodiments, the user interface includes a display to show user instructions and feedback related to input user commands. The network interface includes a physical interface circuit for sending and receiving data and control communications over a conventional network.

Figure 7:
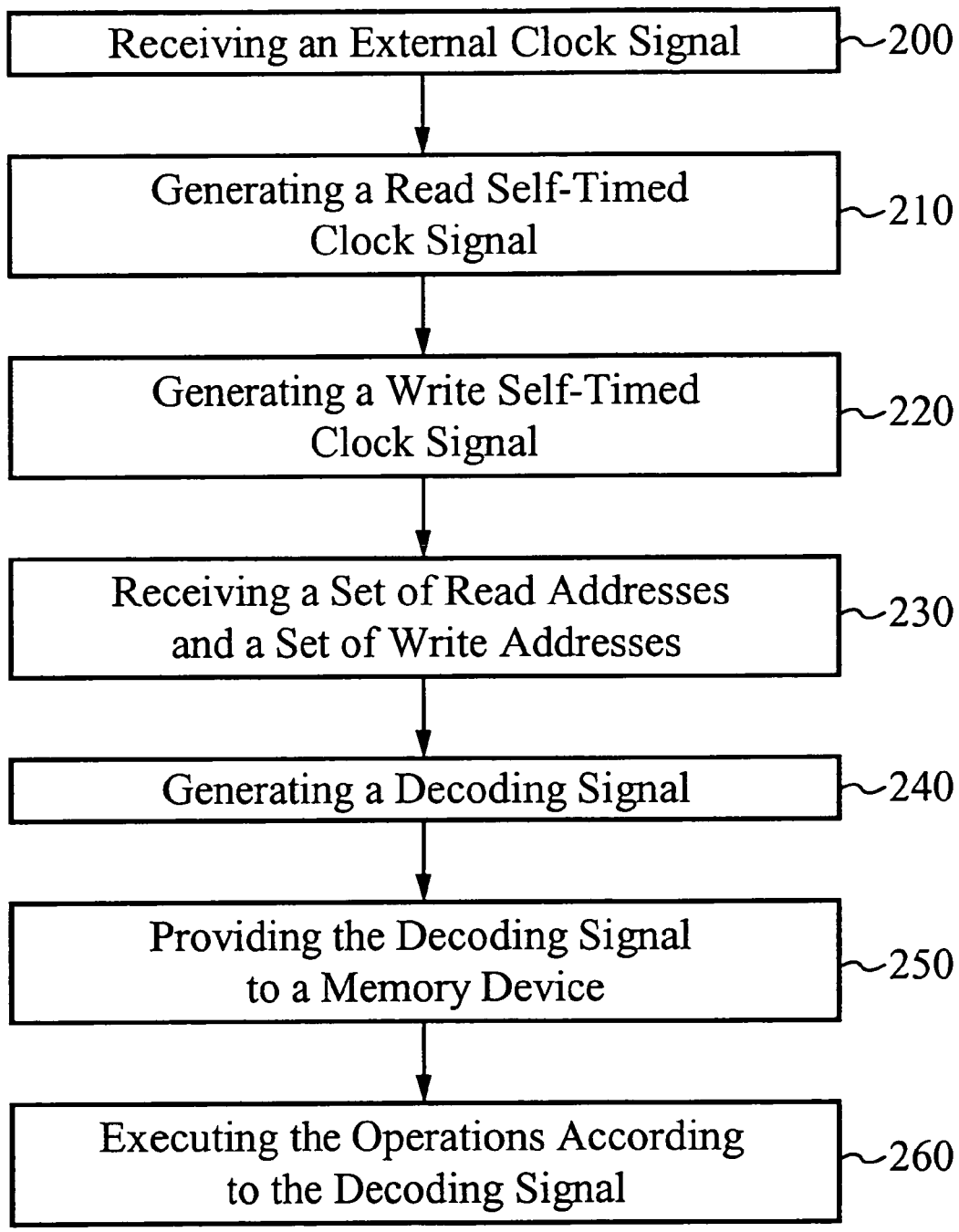
FIG. 7 illustrates a method of generating the dual-operation decoding signal.

FIG. 7 illustrates a method of generating the dual-operation decoding signal. At the step 200, an external clock signal is received. At the step 210, a read self-timed clock signal is generated. The read self-timed clock signal includes a series of read pulses, each read pulse is triggered in response to a rising edge of the external clock signal. At the step 220, a write self-timed clock signal is generated. The write self-timed clock signal includes a series of write pulses, each write pulse is triggered in response to a falling edge of each read pulse. At the step 230, a set of read address and a set of write addresses are received. At the step 240, a decoding signal is generated in response to the read self-timed clock signal, the set of read addresses, the write self-timed clock signals, and the set of write addresses. The decoding signal corresponds to a read operation and write operation. At the step 250, the decoding signal is provided to a memory device. At the step 260, the read operation and the write operation are executed according to the decoding signal.

In operation, the dual operation memory device receives a decoding signal from which a read operation and/or a write operation is performed during a single clock cycle. A clock generating circuit generates a read self-timed clock signal including a series of read pulses, each read pulse is triggered by the falling edge of an external clock signal. The clock generating circuit also generates a write self-timed clock signal that includes a series of write pulses, each write pulse is triggered by a falling edge of a read pulse. A decoding signal circuit receives the read self-timed clock signal and the write self-timed clock signal. The decoding signal circuit also receives a set of read addresses and a set of write addresses. The decoding signal circuit generates a decoding signal in response to the read self-timed clock signal, the set of read addresses, the write self-timed clock signal, and the set of write addresses. The decoding signal includes a read decoding signal that represents a read operation to be performed at a specific read address, and a write decoding signal that represents a write operation to be performed at a specific write address. If the read address and the write address are the same, then a single decoding signal is generated. If the read address is different than the write address, then the decoding signal is composed of two separate signals, the read decoding signal directed to the read address and the write decoding signal directed to the write address.

Both read and write operations are performed in the same cycle for separate data input and output pins, which has better turn-around time in a high-speed design. The benefit of the decoding signal circuit is that the decoding pulse width has better tracking with actual memory operation time needed. The decoding signal circuit is utilized to achieve high-speed performance by giving enough read sensing or write time, without giving too much idling time that wastes the cycle time.

The present invention has been described in terms of specific embodiments incorporating details to facilitate the understanding of the principles of construction and operation of the invention. Such references, herein, to specific embodiments and details thereof are not intended to limit the scope of the claims appended hereto. It will be apparent to those skilled in the art that modifications can be made in the embodiments chosen for illustration without departing from the spirit and scope of the invention.

What is claimed is:

1. A circuit to generate a decoding signal for a memory device:
   a clock generating circuit configured to receive an external clock signal, to generate a read pulse in response to a rising edge of the external clock signal, and to generate a write pulse in response to a falling edge of the read pulse; and
   a decoding signal circuit coupled to receive the read pulse and the write pulse from the clock generating circuit, wherein the decoding signal circuit is configured to generate a decoding signal in response to the read pulse and the write pulse, further wherein the decoding signal corresponds to a read operation and a write operation executed in one cycle of the external clock signal.

2. The circuit of claim 1 wherein the decoding signal circuit is further configured to receive a read memory address and a write memory address and to generate the decoding signal according to the read memory address and the write memory address.

3. The circuit of claim 2 wherein the decoding signal circuit comprises a first latching circuit configured to generate a read decoding signal according to the read pulse and the read address, wherein the read decoding signal corresponds to the read operation.

4. The circuit of claim 3 wherein the decoding signal circuit further comprises a second latching circuit configured to generate a write decoding signal according to the write pulse and the write address, wherein the write decoding signal corresponds to the write operation.

5. The circuit of claim 4 wherein a duty cycle of the decoding signal comprises a duty cycle of the read pulse plus a duty cycle of the write pulse.

6. The circuit of claim 5 wherein the duty cycle of the decoding signal further comprises a gap time between generating the read decoding signal and generating the write decoding signal.

7. The circuit of claim 6 wherein the decoding signal circuit comprises a third latching circuit configured to generate a high decoding signal during the gap time.

8. The circuit of claim 2 wherein if the read memory address and the write memory address are the same memory address, then the decoding signal circuit is configured to generate a single decoding signal directed to the memory address.

9. The circuit of claim 2 wherein if the read memory address is different than the write memory address, then the decoding signal circuit is configured to generate a read decoding signal directed to the read memory address and a write decoding signal directed to the write memory address.

10. The circuit of claim 1 wherein the memory device comprises a high-speed SRAM device.

* * * * *